United States Patent
Choi et al.

(10) Patent No.: US 10,062,768 B2
(45) Date of Patent: Aug. 28, 2018

(54) FIELD-EFFECT TRANSISTOR (FET) DEVICES EMPLOYING ADJACENT ASYMMETRIC ACTIVE GATE / DUMMY GATE WIDTH LAYOUT

(71) Applicant: QUALCOMM Incorporated, San Diego, CA (US)

(72) Inventors: Youn Sung Choi, San Diego, CA (US); Ukjin Roh, Escondido, CA (US); Shashank Ekbote, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/454,099

(22) Filed: Mar. 9, 2017

(65) Prior Publication Data

US 2018/0061943 A1      Mar. 1, 2018

Related U.S. Application Data

(63) Continuation of application No. 15/245,777, filed on Aug. 24, 2016, now Pat. No. 9,634,138.

(51) Int. Cl.
*H01L 29/66* (2006.01)
*H01L 29/06* (2006.01)
(Continued)

(52) U.S. Cl.
CPC ...... *H01L 29/66545* (2013.01); *H01L 23/535* (2013.01); *H01L 29/0653* (2013.01);
(Continued)

(58) Field of Classification Search
CPC ......... H01L 29/66545; H01L 29/66606; H01L 29/772; H01L 29/78; H01L 29/7811;
(Continued)

(56) References Cited

U.S. PATENT DOCUMENTS

| 7,777,282 B2 | 8/2010 | Majhi et al. |
| 8,193,094 B2 | 6/2012 | Wang |

(Continued)

OTHER PUBLICATIONS

Notice of Allowance for U.S. Appl. No. 15/245,777, dated Jan. 20, 2017, 8 pages.

(Continued)

*Primary Examiner* — Eduardo A Rodela
(74) *Attorney, Agent, or Firm* — Withrow & Terranova, PLLC

(57) ABSTRACT

Field-Effect Transistor (FET) devices employing an adjacent asymmetric active gate/dummy gate width layout are disclosed. In an exemplary aspect, a FET cell is provided that includes a FET device having an active gate, a source region, and a drain region. The FET cell also includes an isolation structure comprising a dummy gate over a diffusion break located adjacent to one of the source region and the drain region. The FET cell has an asymmetric active gate/dummy gate width layout in that a width of the active gate is larger than a width of the adjacent dummy gate. The increased width of the active gate provides increased gate control and the decreased width of the dummy gate increases isolation from the dummy gate, thus reducing sub-threshold leakage through the dummy gate.

16 Claims, 11 Drawing Sheets

(51) Int. Cl.
*H01L 23/535* (2006.01)
*H01L 29/78* (2006.01)
*H01L 29/423* (2006.01)
*H01L 29/772* (2006.01)

(52) U.S. Cl.
CPC .. *H01L 29/42376* (2013.01); *H01L 29/66606* (2013.01); *H01L 29/66795* (2013.01); *H01L 29/772* (2013.01); *H01L 29/78* (2013.01); *H01L 29/7851* (2013.01)

(58) Field of Classification Search
CPC ............. H01L 29/7834; H01L 29/7835; H01L 2224/03011; H01L 2224/11011; H01L 2224/27011
See application file for complete search history.

(56) References Cited

U.S. PATENT DOCUMENTS

| | | | |
|---|---|---|---|
| 8,383,485 B2 | 2/2013 | Wang | |
| 8,846,491 B1 | 9/2014 | Pham et al. | |
| 8,969,958 B1 * | 3/2015 | Khemka | H01L 29/0847 |
| | | | 257/341 |
| 9,171,752 B1 | 10/2015 | Wu et al. | |
| 9,209,182 B2 | 12/2015 | Chern et al. | |
| 9,324,866 B2 | 4/2016 | Yu et al. | |
| 9,368,496 B1 | 6/2016 | Yu et al. | |
| 9,634,138 B1 | 4/2017 | Choi et al. | |
| 2003/0047781 A1 * | 3/2003 | Lee | H01L 29/66772 |
| | | | 257/347 |
| 2006/0141694 A1 | 6/2006 | Bae et al. | |
| 2009/0250733 A1 * | 10/2009 | Adkisson | H01L 27/14603 |
| | | | 257/292 |
| 2010/0244153 A1 * | 9/2010 | Hsu | H01L 21/823807 |
| | | | 257/408 |
| 2011/0260247 A1 * | 10/2011 | Yang | H01L 29/0653 |
| | | | 257/343 |
| 2013/0015524 A1 * | 1/2013 | Hsu | H01L 21/28123 |
| | | | 257/344 |
| 2014/0117454 A1 * | 5/2014 | Liu | H01L 29/6681 |
| | | | 257/368 |
| 2014/0252491 A1 | 9/2014 | Onoda | |
| 2014/0264572 A1 | 9/2014 | Kim et al. | |
| 2015/0021695 A1 | 1/2015 | Hu et al. | |
| 2015/0115373 A1 | 4/2015 | Yu et al. | |
| 2015/0214341 A1 | 7/2015 | Shin et al. | |
| 2015/0243659 A1 | 8/2015 | Huang et al. | |
| 2016/0111320 A1 | 4/2016 | Shen et al. | |
| 2016/0111524 A1 | 4/2016 | Ha et al. | |
| 2016/0181276 A1 * | 6/2016 | Cheng | H01L 27/1203 |
| | | | 257/351 |

OTHER PUBLICATIONS

International Search Report and Written Opinion for PCT/US2017/047747, dated Dec. 4, 2017, 16 pages.

* cited by examiner

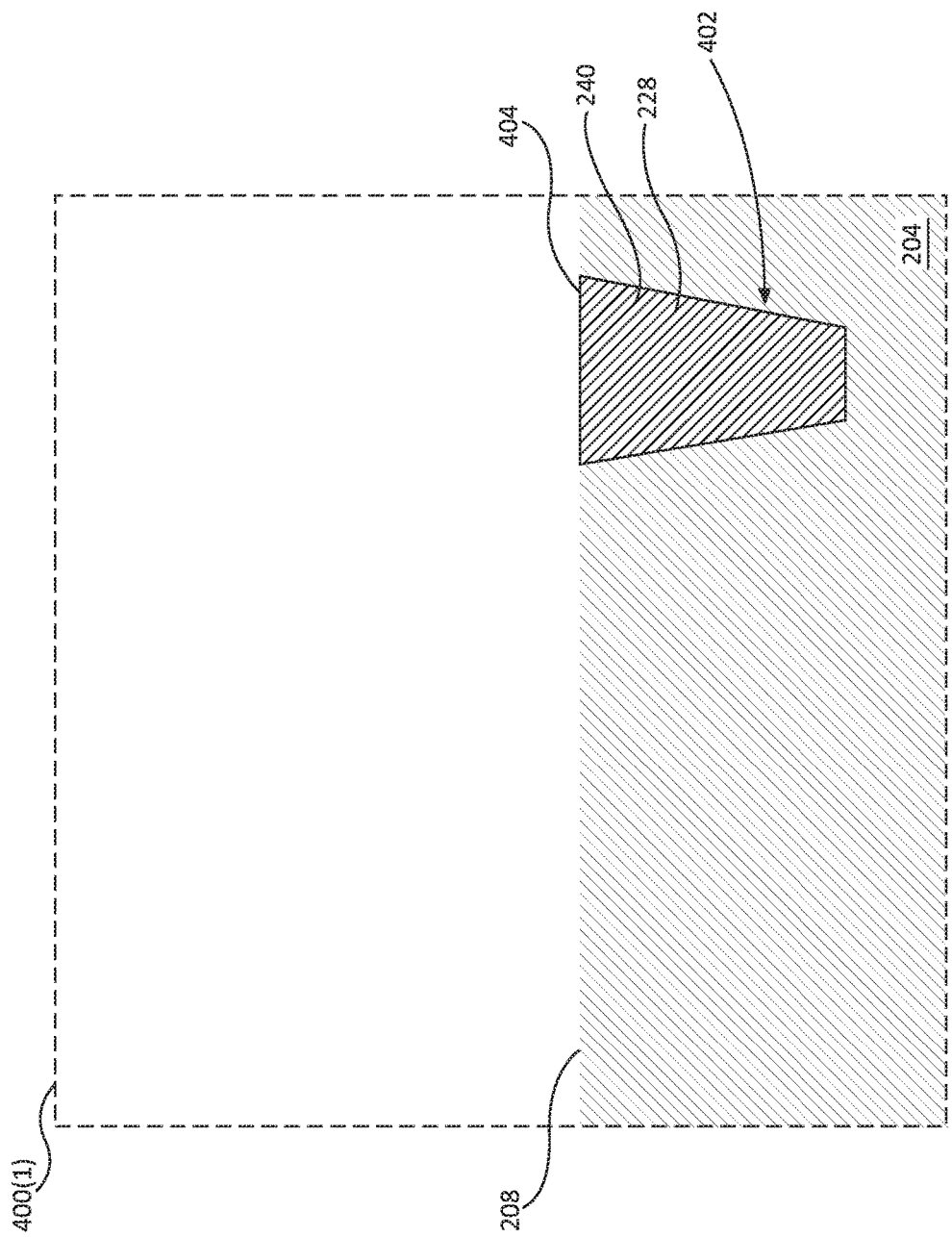

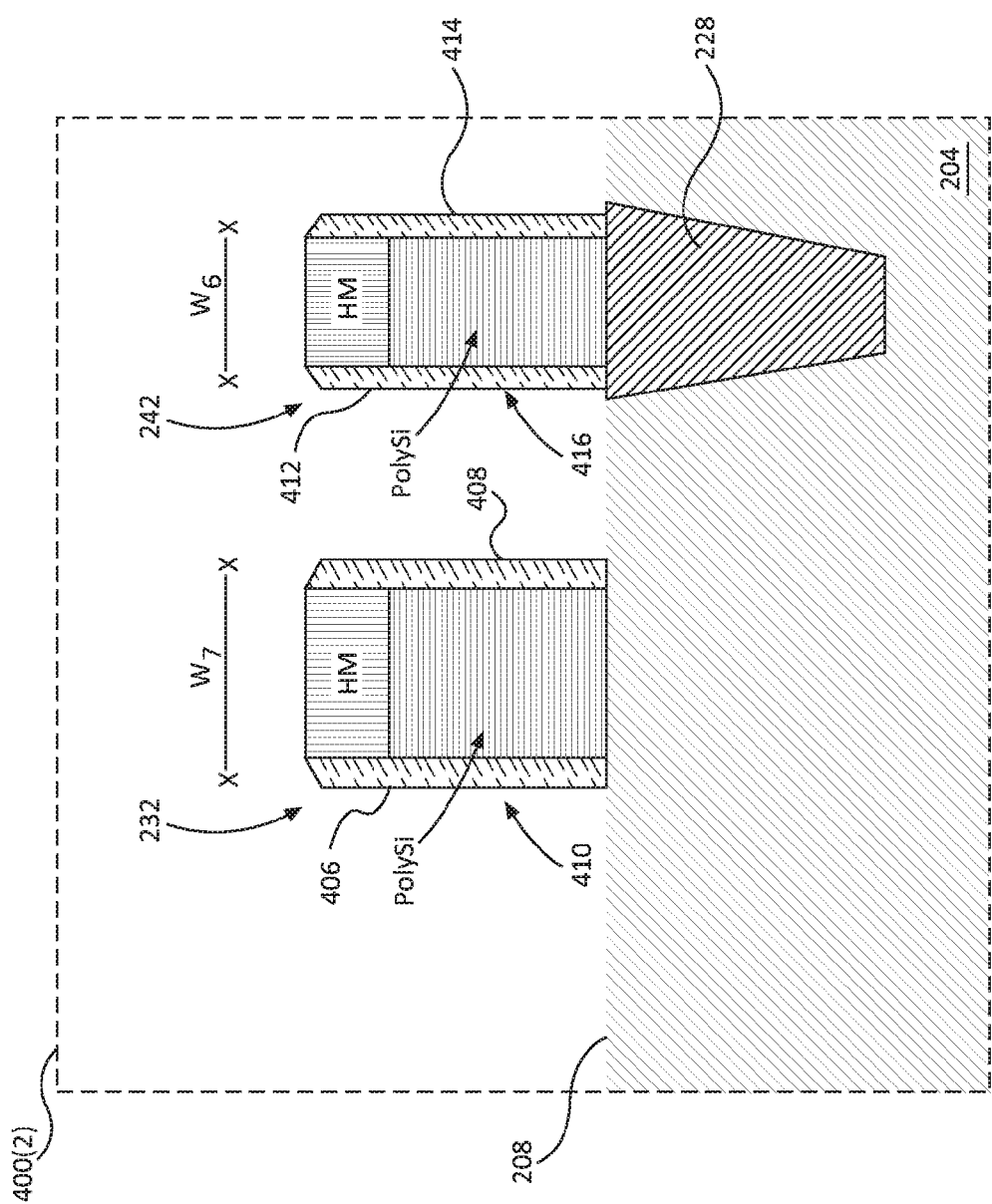

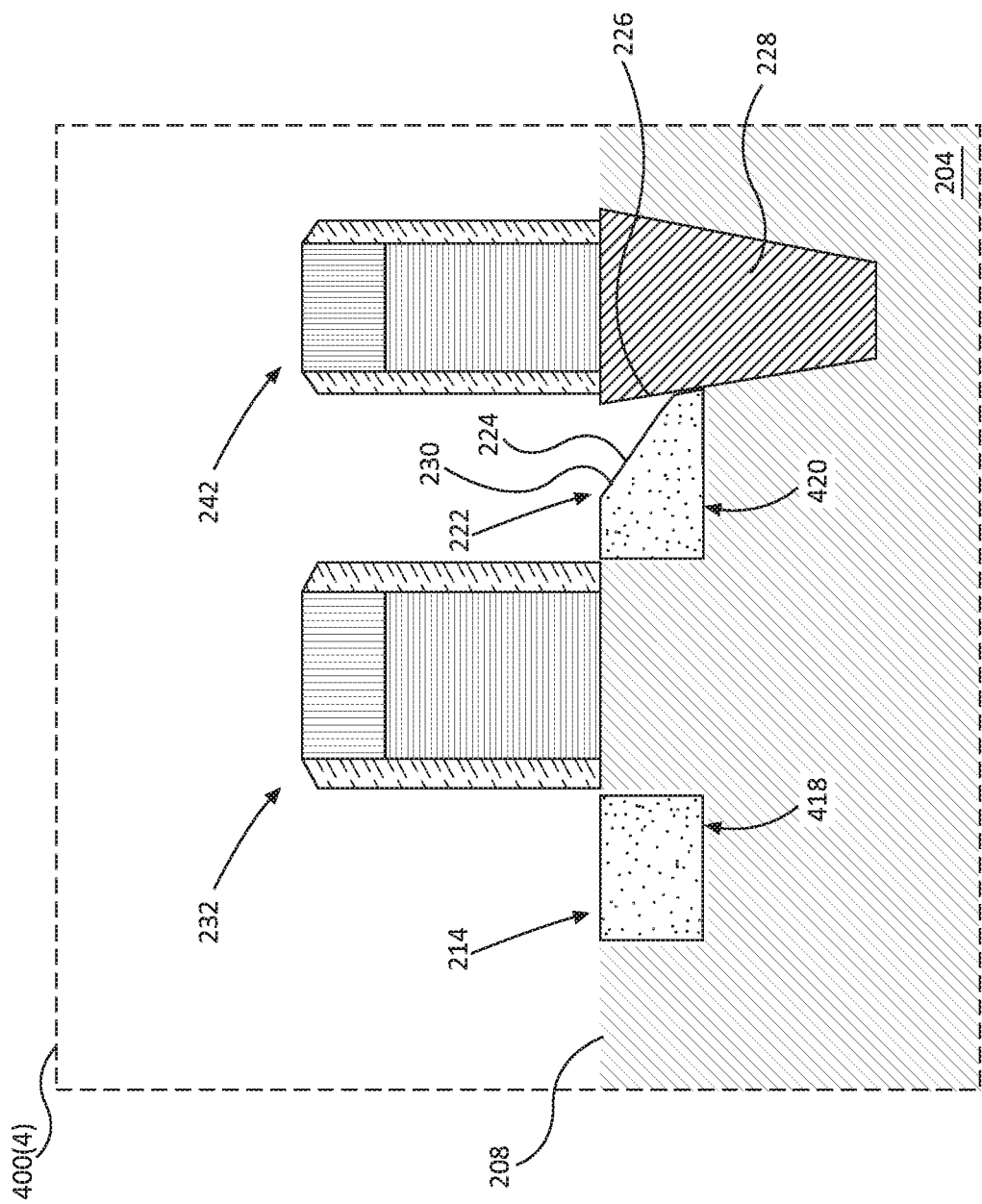

FIELD-EFFECT TRANSISTOR (FET) DEVICES EMPLOYING ADJACENT ASYMMETRIC ACTIVE GATE / DUMMY GATE WIDTH LAYOUT

PRIORITY APPLICATION

The present application is a continuation of and claims priority under 35 U.S.C. § 120 to U.S. patent application Ser. No. 15/245,777 filed on Aug. 24, 2016 and entitled "FIELD-EFFECT TRANSISTOR (FET) DEVICES EMPLOYING ADJACENT ASYMMETRIC ACTIVE GATE/DUMMY GATE WIDTH LAYOUT," which is incorporated herein by reference in its entirety.

BACKGROUND

I. Field of the Disclosure

The technology of the disclosure relates generally to Field-Effect Transistors (FETs), and more specifically to the layout of gate structures in FETs.

II. Background

Transistors are essential components in modern electronic devices. Large quantities of transistors are employed in integrated circuits (ICs) in many modern electronic devices. For example, components of modern electronic devices, such as central processing units (CPUs) and memory units, employ a large quantity of transistors for logic circuits and data storage.

In the course of IC evolution, functional density (i.e., the number of interconnected devices per chip area) has increased. This increase in functional density is achieved in part through continued efforts to scale down transistor cells in ICs (e.g., reducing the size of transistor nodes in order to place increasingly more transistor nodes into the same amount of space). Transistor cells can be scaled down by a reduction in gate width and/or channel length of transistor nodes therein, for example. Transistors cells can also be scaled down by reducing the size of an isolation structure isolating a transistor node therein from adjacent transistor cells. For example, a transistor cell that includes an isolation structure comprising a double diffusion break (DDB) can be scaled down by instead implementing a single diffusion break (SDB).

For example, FIG. 1 is a cross-section of a conventional Fin Field-Effect Transistor (FET) (FinFET) cell 100. The FinFET cell 100 includes a FinFET 102 that includes an active gate 104 of a width $W_1$ (e.g., fourteen (14) or sixteen (16) nanometers (nm)). The FinFET 102 further includes source and drain epitaxial regions 108 and 110 grown on a substrate 112. The source and drain epitaxial regions 108 and 110 are located in respective source and drain columns 114 and 116. The source and drain epitaxial regions 108 and 110 may comprise an epitaxial growth of Silicon Germanium (SiGe) or Germanium (Ge), for example. The source and drain epitaxial regions 108 and 110 include source and drain implants 118 and 120, respectively, for providing a corresponding source or drain to each of the source and drain epitaxial regions 108 and 110. The source and drain implants 118 and 120 may be formed by ion implantation, for example. The FinFET 102 further includes source and drain contacts 122 and 124 for providing access to the source and drain epitaxial regions 108 and 110, respectively, and thus, for providing access to an active channel region 126 between the source and drain epitaxial regions 108 and 110 under the active gate 104. The drain contact 124 is isolated from the active gate 104 by a distance $D_1$ and from a dummy gate 134 by a distance $D_2$. The dummy gate 134 has a width indicated as $W_4$ in FIG. 1. In the FinFET 102, the distances $D_1$ and $D_2$ are substantially similar. It is noted that for purposes of clarity, the epitaxial region 108 has been defined as a source epitaxial region 108, the implant 118 of the epitaxial region 108 has been defined as a source implant 118, the epitaxial region 110 has been defined as a drain epitaxial region 110, and the implant 120 of the epitaxial region 110 has been defined as a drain implant 120. However, the source/drain designations of these elements are an example and can be either designated as being for a source or a drain based on how the FinFET cell 100 is connected in the circuit, since the active channel region 126 has no intrinsic polarity.

The FinFET cell 100 further includes an SDB isolation structure 129 to provide isolation between the FinFET 102 and, for example, an adjacent FinFET cell (not shown). The SDB isolation structure 129 comprises an SDB 130 of a width $W_2$. The SDB 130 may include a shallow trench isolation oxide, for example. The SDB isolation structure 129 further includes the dummy gate 134.

Under the configuration of the FinFET cell 100 described above, the FinFET cell 100 has a width $W_3$ (i.e., the space occupied by a single FinFET cell in an array of cells) that depends, for example, on the width $W_1$ of the active gate 104, a distance $D_3$ between the active gate 104 and the dummy gate 134, and the width $W_2$ of the SDB 130. Thus, the FinFET cell 100 can be scaled down by, for example, by reducing one or more of the width $W_1$ of the active gate 104, the distance $D_3$ between the active gate 104 and the dummy gate 134, or the width $W_2$ of the SDB 130. However, scaling down the FinFET cell 100 in this manner may be limited by fabrication and performance considerations. For example, due to fabrication limitations and/or isolation requirements, reducing the distance $D_3$ may place the drain epitaxial region 110 closer to the SDB 130. Thus, during fabrication, the epitaxial growth of the drain epitaxial region 110 may be uneven across a top surface 142 of the drain epitaxial region 110 due to a facet mismatch between a facet 140 of the drain epitaxial region 110 and a facet 144 of the SDB 130. In particular, the facet 140 of the drain epitaxial region 110 may not match the facet 144 of the SDB 130, thus hindering growth of the drain epitaxial region 110 near the facet 144 of the SDB 130. Accordingly, growth of the drain epitaxial region 110 near the facet 144 of the SDB 130 will be slower than the growth of the drain epitaxial region 110 away from the facet 144 of the SDB 130. This uneven growth is illustrated in FIG. 1 by the uneven top surface 142 of the drain epitaxial region 110. This uneven growth of the drain epitaxial region 110 may result in reduced gate control and increased sub-threshold current in the FinFET 102. In particular, during later formation of the source implant 118 and the drain implant 120 in the source and drain epitaxial regions 108 and 110, respectively, the drain implant 120 may be disposed deeper in the drain epitaxial region 110 than desired, and deeper than the source implant 118 in the source epitaxial region 108 by a source/drain implant margin 146. This results in the active channel region 126 that is lower in the substrate 112 than desired, and thus further from the active gate 104 than desired. Having the active channel region 126 further from the active gate 104 than desired can result in reduced gate control of the active channel region 126, and thus degraded performance of the FinFET 102. Furthermore, having the active channel region 126 further from the active gate 104 than desired can result in a lower voltage threshold than desired for the FinFET 102. This decreased voltage threshold increases sub-threshold current, as the active gate 104 may not be able to fully close the active channel region 126 during an "off" state of the FinFET cell 100, thus increasing power consumption and degrading performance.

Current leakage can also result based on the dummy gate 134 being located close to the drain epitaxial region 110 and the drain contact 124. As the pitch of the FinFET 102 is reduced, the distance between the dummy gate 134 and the drain epitaxial region 110 and the drain contact 124 may be reduced. For example, distance $D_2$ may be reduced as pitch is reduced. This close proximity between the drain contact 124 and the dummy gate 134 may result in a potential leakage current path 148 through the dummy gate 134, thus also increasing power consumption and degrading performance of the FinFET 102.

SUMMARY OF THE DISCLOSURE

Aspects disclosed in the detailed description include Field-Effect Transistor (FET) devices employing an adjacent asymmetric active gate/dummy gate width layout. In an exemplary aspect, a FET cell is provided that includes a FET device having an active gate configured to control a channel region between a source region and a drain region. The FET cell also includes an isolation structure disposed adjacent to the FET device. The isolation structure comprises a diffusion break located adjacent to one of the source region and the drain region of the FET device, and a dummy gate overlaying the diffusion break. The FET cell has an asymmetric active gate/dummy gate width layout in that a width of the dummy gate is smaller than a width of the active gate. The larger width of the active gate can provide increased gate control over the channel region, and therefore reduced sub-threshold leakage current.

As additional examples, providing an adjacent asymmetric active gate/dummy gate width layout may also mitigate the negative effects of a non-ideal growth of the source and/or drain regions that result in a deeper source or drain implant. Non-ideal growth of the source and/or drain regions lowers the channel region of the FET device, thus placing the channel region farther from the active gate. Furthermore, as another example, providing a smaller width of the dummy gate in a FET cell allows the FET cell to maintain cell pitch even though the active gate of the FET device has a larger width. Furthermore, as another example, providing a decreased width dummy gate may allow formation of the source/drain regions, implants, and contacts according to current fabrication processes. Furthermore, as an example, providing a decreased width dummy gate increases a separation between the dummy gate and an adjacent source and/or drain region, thus increasing the distance and isolation between the FET device and the dummy gate, thereby decreasing leakage current through the dummy gate.

In this regard in one aspect, a FET cell having an asymmetric gate width layout is provided. The FET cell comprises a substrate comprising a body having a top surface, and a FET device. The FET device comprises a source disposed in the substrate. The FET device further comprises a drain disposed in the substrate. The FET device further comprises an active gate of an active gate width formed between the source and the drain. The FET cell further comprises an isolation structure disposed in the substrate adjacent to the FET device. The isolation structure comprises a diffusion break disposed in the substrate adjacent to one of the source and the drain of the FET device, wherein a depth of the one of the source and the drain that is adjacent to the diffusion break is greater than a depth of the one of the source and the drain that is not adjacent to the diffusion break. The isolation structure further comprises a dummy gate of a dummy gate width formed above the diffusion break adjacent to the active gate. The dummy gate width is smaller than the active gate width by a gate width margin.

In another aspect, a method of fabricating a FET cell in a semiconductor die is provided. The method comprises forming a diffusion break disposed in the substrate. The method further comprises forming an active gate of an active gate width on the substrate, and forming a dummy gate of a dummy gate width above the diffusion break and adjacent to the active gate, the dummy gate width being smaller than the active gate width by a gate width margin. The method further comprises forming a source epitaxial region of a FET device in the substrate, adjacent to the active gate, and forming a source in the source epitaxial region at a first depth from a top surface of the substrate. The method further comprises forming a drain epitaxial region of the FET device in the substrate, adjacent to the diffusion break, between the active gate and the dummy gate, a portion of the drain epitaxial region in contact with the diffusion break, and forming a drain in the drain epitaxial region at a second depth from the top surface of the substrate that is greater than the first depth. The method further comprises forming a channel region of the FET device in the substrate between the source and the drain.

In another aspect, a FET cell having an asymmetric gate width layout is provided. The FET cell comprises a means for providing a substrate comprising a body having a top surface. The FET cell further comprises a means for providing a FET device, comprising a means for providing a source disposed in the means for providing the substrate at a first depth from a top surface of the means for providing the substrate, and a means for providing a drain disposed in the means for providing the substrate at a second depth from the top surface of the means for providing the substrate. The means for providing the FET device further comprises a means for providing an active gate of an active gate width formed between the means for providing the source and the means for providing the drain. The means for providing the active gate is configured to control conductivity in a channel region below the means for providing the active gate between the means for providing the source and the means for providing the drain. The FET cell further comprises a means for providing an isolation structure disposed in the means for providing the substrate adjacent to the means for providing the FET device. The means for providing the isolation structure comprises a means for providing a diffusion break disposed in the means for providing the substrate adjacent to one of the means for providing the source and the means for providing the drain of the means for providing the FET device. A depth of the one of the means for providing the source and the means for providing the drain that is adjacent to the means for providing the diffusion break is greater than a depth of the one of the means for providing the source and the means for providing the drain that is not adjacent to the means for providing the diffusion break. The means for providing the isolation structure further comprises a means for providing a dummy gate of a dummy gate width formed above the means for providing the diffusion break adjacent to the means for providing the active gate, the dummy gate width being smaller than the active gate width by a gate width margin.

BRIEF DESCRIPTION OF THE FIGURES

FIG. 4A is a cross-sectional diagram of an exemplary fabrication stage of forming a diffusion break in a substrate for fabricating the exemplary FinFET cell illustrated in FIG. 2;

FIG. 4B is a cross-sectional diagram of an exemplary fabrication stage of forming an active gate of an active gate width on a substrate and forming a dummy gate of a dummy gate width above a diffusion break and adjacent to the active gate, the dummy gate width being smaller than the active gate width by a gate width margin to form an asymmetric gate width layout for fabricating the exemplary FinFET cell illustrated in FIG. 2;

FIG. 4D is a cross-sectional diagram of an exemplary fabrication stage of depositing of a source epitaxial region and a drain epitaxial region on corresponding recesses for fabricating the exemplary FinFET cell illustrated in FIG. 2;

DETAILED DESCRIPTION

Figure 1:
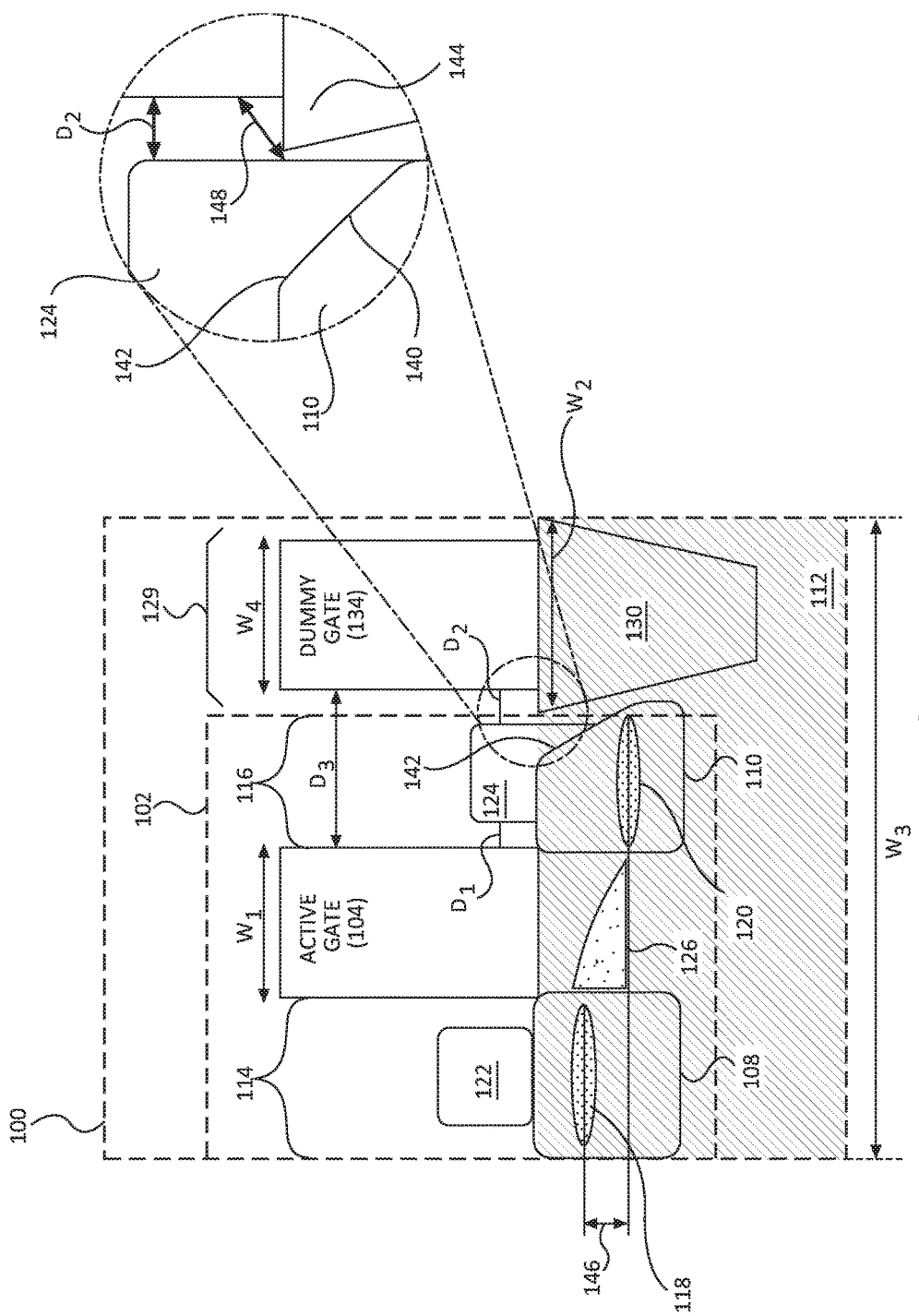
FIG. 1 illustrates a cross-section of a conventional Fin Field-Effect Transistor (FET) (FinFET) cell.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include Field-Effect Transistor (FET) devices employing an adjacent asymmetric active gate/dummy gate width layout. In an exemplary aspect, a FET cell is provided that includes a FET device having a active gate configured to control a channel region between a source region and a drain region. The FET cell also includes an isolation structure disposed adjacent to the FET device. The isolation structure comprises a diffusion break located adjacent to one of the source region and the drain region of the FET device, and a dummy gate overlaying the diffusion break. The FET cell has an asymmetric active gate/dummy gate width layout in that a width of the dummy gate is smaller than a width of the active gate. The larger width of the active gate can provide increased gate control over the channel region, and therefore reduced sub-threshold leakage current.

As additional examples, providing an adjacent asymmetric active gate/dummy gate width layout may also mitigate the negative effects of a non-ideal growth of the source and/or drain regions that result in a deeper source or drain implant. Non-ideal growth of the source and/or drain regions lowers the channel region of the FET device, thus placing the channel region farther from the active gate. Furthermore, as another example, providing a smaller width of the dummy gate in a FET cell allows the FET cell to maintain cell pitch even though the active gate of the FET device has a larger width. Furthermore, as another example, providing a decreased width dummy gate may allow formation of the source/drain regions, implants, and contacts according to current fabrication processes. Furthermore, as an example, providing a decreased width dummy gate increases a separation between the dummy gate and an adjacent source and/or drain region, thus increasing the distance and isolation between the FET device and the dummy gate, thereby decreasing leakage current through the dummy gate.

Figure 2:
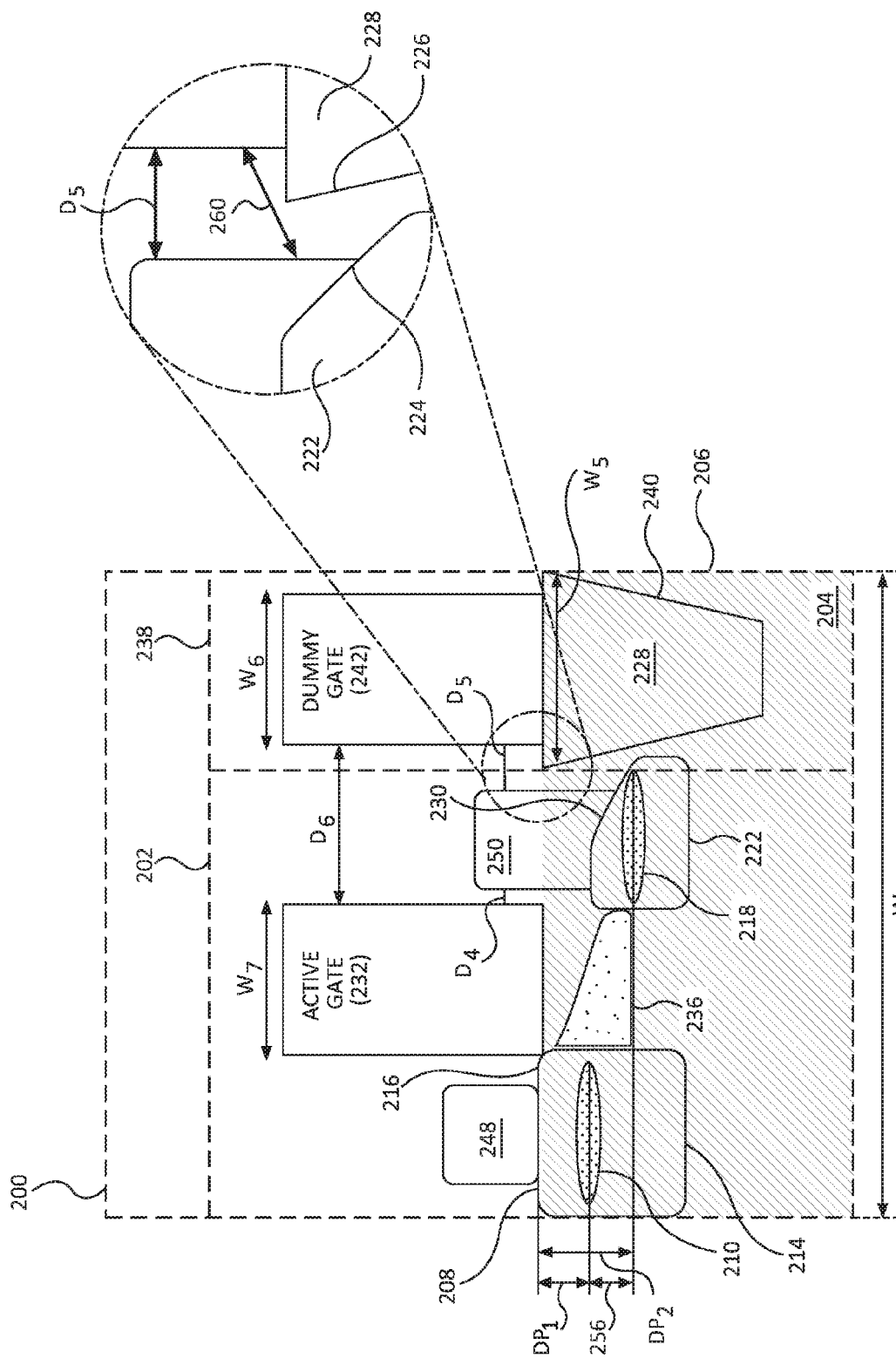
FIG. 2 illustrates a cross-section of an exemplary FinFET cell that includes an exemplary FinFET employing an adjacent asymmetric active gate/dummy gate width layout, which can promote increased gate control for reducing leakage current.

In this regard, FIG. 2 illustrates a cross-section of an exemplary FinFET cell 200 that includes an exemplary FinFET 202 employing an adjacent asymmetric active gate/ dummy gate width layout. As shown in FIG. 2, the FinFET cell 200 includes a substrate 204 comprising a body 206 having a top surface 208. The FinFET cell 200 comprises an isolation structure 238 disposed in the substrate 204 adjacent to the FinFET 202. The isolation structure 238 is disposed in the FinFET cell 200 to isolate the FinFET 202 from an adjacent cell (not shown), such as an adjacent FinFET cell for example. The isolation structure 238 comprises a single diffusion break (SDB) 228, and is disposed in the substrate 204 adjacent to a drain 218 of the FinFET 202. The SDB 228 has a width $W_5$ and may comprise a shallow trench isolation (STI) oxide 240, for example. The isolation structure 238 further comprises a dummy gate 242 of a dummy gate width $W_6$ formed above the SDB 228, adjacent to the active gate 232.

The FinFET 202 of the FinFET cell 200 comprises a source 210 disposed in the substrate 204 at a depth $DP_1$ from the top surface 208 of the substrate 204. The source 210 of the FinFET 202 is formed on a source epitaxial region 214 in the substrate 204 by ion implantation. As one example, the source epitaxial region 214 may include an epitaxial growth of Silicon Germanium (SiGe) or Germanium (Ge), in the substrate 204. The source epitaxial region 214 of the FinFET cell 200 can have an even top surface 216 that is flush with the top surface 208 of the substrate 204.

With continuing reference to FIG. 2, the FinFET 202 further comprises a drain 218 disposed in the substrate 204 at a depth $DP_2$ from the top surface 208 of the substrate 204, the depth $DP_2$ being greater than depth $DP_1$. The drain 218 is formed on a drain epitaxial region 222 by ion implantation. As one example, the drain epitaxial region 222 comprises an epitaxial growth of Silicon Germanium (SiGe) or Germanium (Ge), for example, on the substrate 204. The depth $DP_2$ of the drain 218 is greater than the depth $DP_1$ of the source 210 because these depths $DP_1$, $DP_2$ are a function of a height and shape of the top surface 216 and a top surface 230 of the source epitaxial region 214 and the drain epitaxial region 222, respectively. As will be described in further detail below, the top surface 230 of the drain epitaxial region 222 is uneven and lower than the top surface 216 of the source epitaxial region 214. Accordingly, the drain 218 is formed lower, relative to the top surface 208 of the substrate 204, than the source 210. It is noted that for purposes of clarity, the epitaxial region 214 has been defined as a source epitaxial region 214, the source 210 of the epitaxial region 214 has been defined as a source 210, the epitaxial region 222 has been defined as a drain epitaxial region 222, and the drain 218 of the epitaxial region 222 has been defined as a drain 218. However, the source/drain designations of these elements are an example and can be designated as being for a source or a drain based on how the FinFET 202 is connected in the circuit, since a channel region 236 has no intrinsic polarity.

As illustrated in the example FinFET cell 200 in FIG. 2, the drain epitaxial region 222 was grown unevenly. This uneven growth is due to a facet mismatch between a facet 224 of the drain epitaxial region 222 and a facet 226 of the SDB 228 disposed adjacent to the drain epitaxial region 222, thus hindering growth of the drain epitaxial region 222 near the facet 226 of the SDB 228. Accordingly, growth of the drain epitaxial region 222 near the facet 226 of the SDB 228 will be slower, and thus lower in the substrate 204, than the growth of the drain epitaxial region 222 away from the facet 226 of the SDB 228. Therefore, the drain epitaxial region 222 has an uneven top surface 230 that is lower near the SDB 228.

With continuing reference to FIG. 2, the FinFET 202 also comprises an active gate 232 of an active gate width $W_7$ formed between the source 210 and the drain 218. The FinFET 202 further comprises the channel region 236 below the active gate 232 between the source 210 and the drain 218. Thus, the active gate 232 is configured to control conductivity in the channel region 236 between the source 210 and the drain 218 based on a field (not shown) generated by the active gate 232 when a voltage is applied thereto.

The FinFET 202 further includes a source contact 248 disposed on the source epitaxial region 214, adjacent to the active gate 232, for providing access to the source 210. The FinFET 202 further includes a drain contact 250 disposed on the drain epitaxial region 222, between the active gate 232 and the dummy gate 242, for providing access to the drain 218. The drain contact 250 is isolated from the active gate 232 by a distance $D_4$. The drain contact 250 is isolated from the dummy gate 242 by a distance $D_5$.

In the FinFET cell 200, the uneven growth of the drain epitaxial region 222 may result in reduced gate control and increased sub-threshold current. In particular, during formation of the source 210 and the drain 218 in the FinFET 202, through ion implantation for example, the drain 218 may be disposed deeper in the drain epitaxial region 222 than desired, and deeper than the source 210, by a source/drain implant margin 256. This results in the channel region 236 being lower in the substrate 204 than desired, and thus further from the active gate 232 than desired. Having the channel region 236 further from the active gate 232 than desired can result in reduced gate control of the channel region 236, and thus degraded performance of the FinFET 202.

In this regard, in the exemplary FinFET cell 200 in FIG. 2, to mitigate or offset reduced gate control of the channel region 236 due to the channel region 236 being located lower in the substrate 204, the dummy gate 242 is formed in the FinFET cell 200 to have a smaller dummy gate width $W_6$ than the active gate width $W_7$ by a gate width margin, i.e., a difference between the active gate width $W_7$ and the dummy gate width $W_6$. As an example, this gate width margin can be at least two (2) nanometers (nm). For example, the active gate width $W_7$ could be approximately fifteen (15) nm and the dummy gate width $W_6$ could be approximately thirteen (13) nm, for a gate width margin that is approximately two (2) nm. In view of this exemplary aspect, the FinFET cell 200 has an asymmetric active gate/dummy gate layout, because the active gate width $W_7$ of the active gate 232 is larger than the dummy gate width $W_6$ of the adjacent dummy gate 242. By having an increased active gate width $W_7$, the active gate 232 provides improved control over the channel region 236. This improved gate control decreases sub-threshold leakage current in the FinFET 202 and counters at least some of the increase in sub-threshold leakage current caused by the non-ideal growth of the drain epitaxial region 222 relative to a gate control provided by an active gate of a FET cell of a symmetrical active gate/dummy gate layout, such as the FinFET cell 100 illustrated in FIG. 1.

However, increasing the active gate width $W_7$ reduces a distance $D_6$ between the active gate 232 and the dummy gate 242, which may hinder the epitaxial growth of the drain epitaxial region 222 and the implantation of the drain 218 into the drain epitaxial region 222. In particular, reducing the distance $D_6$ may not provide the space necessary between the active gate 232 and the dummy gate 242 to dispose, etch, implant, or otherwise form materials in the substrate 204. In this regard, in an exemplary aspect, the dummy gate width $W_6$ of the dummy gate 242 is formed smaller than the active gate width $W_7$ by a gate width margin, i.e., a difference between the active gate width $W_7$ and the dummy gate width $W_6$. Having a decreased dummy gate width $W_6$ allows formation of the drain epitaxial region 222 according to current fabrication processes, e.g., fabrication processes used to fabricate the FinFET cell 100 illustrated in FIG. 1. Furthermore, decreasing the dummy gate $W_6$ increases the distance $D_5$ between the drain contact 250 and the dummy gate 242, and a separation 260 between the dummy gate 242 and the adjacent drain contact 250, thus further isolating the FinFET 202 from the dummy gate 242, thereby decreasing a leakage current through the dummy gate 242. Furthermore, in an aspect where the increase of the active gate width $W_7$ matches a decrease of the dummy gate width $W_6$, an isolation margin of the drain contact 250 relative to the active gate 232 and the dummy gate 242 (i.e., the difference between the distance $D_5$ and the distance $D_4$), is approximately half the gate width margin, i.e., a difference between the active gate width $W_7$ and the dummy gate width $W_6$. In particular, the increase of the active gate width $W_7$ expands the active gate 232 equally towards the source contact 248 and the drain contact 250. Accordingly, the distance $D_4$ between the active gate 232 and the drain contact 250 is reduced by the increase of the active gate width $W_7$ towards the drain contact 250. Therefore, the distance $D_4$ between the active gate 232 and the drain contact 250 is reduced by half of the increase in the active gate width $W_7$.

Specifically, in a symmetrical active gate/dummy gate layout, such as the layout illustrated in FIG. 1 for the FinFET cell 100, the active gate width $W_1$ is limited by several factors. For example, the active gate width $W_1$ of the active gate 104 is limited by the overall width $W_3$ of the FinFET cell 100 having to form the active gate 104 with an active gate width $W_1$, the width $W_4$ of the dummy gate 134, and the distance $D_3$ between the active gate 104 and the dummy gate 134 needed to allow disposing of the source and drain epitaxial regions 108 and 110 in the substrate 112. Thus, gate control in the symmetrical active gate/dummy gate layout, such as the layout illustrated in FIG. 1 for the FinFET cell 100, is limited by a maximum width that the active gate width $W_1$ can be. However, in the asymmetric active gate/dummy gate layout of the FinFET cell 200 of the present application, the active gate width $W_7$ of the active gate 232 is formed larger than the dummy gate width $W_6$ of the adjacent dummy gate 242, thus increasing gate control while having a width $W_8$ that is approximately the same width $W_3$ of the FinFET cell 100 illustrated in FIG. 1.

In addition, having a reduced dummy gate width $W_6$ allows the FinFET cell 200 to maintain the width $W_8$ that is similar to the width $W_3$ of the FinFET cell 100 illustrated in FIG. 1, even when the FinFET cell 200 has an increased active gate width $W_7$ of the active gate 232. In particular, in an aspect, the width $W_6$ of the dummy gate 242 can be decreased by a same amount that the active gate width $W_7$ is increased. This would provide the distance $D_6$ between the active gate 232 and the dummy gate 242 of the FinFET cell 200 to be similar or approximately the same as the distance $D_3$ between the active gate 104 and the dummy gate 134 of the FinFET cell 100 illustrated in FIG. 1. This could also provide for the width $W_8$ of the FinFET cell 200 to be similar or approximately the same as width $W_3$ of the FinFET cell 100 illustrated in FIG. 1. Reducing the width $W_6$ of the dummy gate 242 can increase the distance $D_5$ between the dummy gate 242 and the adjacent drain contact 250, thus reducing the risk of shorts between the dummy gate 242 and the drain contact 250. Accordingly, the FinFET cell 200 may be fabricated using similar fabrication methods used to fabricate the FinFET cell 100 illustrated in FIG. 1.

In the exemplary aspect described above, the gate width margin was defined as at least two (2) nm, as an example. As a further example, the active gate width $W_7$ was defined as approximately fifteen (15) nm and the dummy gate width $W_6$ as approximately thirteen (13) nm, providing a gate width margin that is approximately two (2) nm. In a further example, the active gate width $W_7$ can be approximately seventeen (17) nm and the dummy gate width $W_6$ can be approximately fourteen (14) nm, to provide a gate width margin that is approximately three (3) nm. In another aspect, the gate width margin can be at least four (4) nm, for example. Thus, the active gate width $W_7$ can be approximately eighteen (18) nm and the dummy gate width $W_6$ can be approximately fourteen (14) nm, to provide a gate width margin that is approximately four (4) nm, for example. Having a larger gate width margin provides increased gate control over an implementation with no gate width margin, because a larger active gate width $W_7$ results in an increased electric field (not shown) over the channel region 236, and thus, increased control over the channel region 236. Furthermore, having a larger gate width margin provides decreased leakage current through the dummy gate 242 over an implementation with no gate width margin, because a narrower dummy gate width $W_6$ results in increased separation 260 between the dummy gate 242 and the adjacent drain contact 250, thus further isolating the FinFET 202 from the dummy gate 242, thereby decreasing a leakage current through the dummy gate 242.

Figure 3:
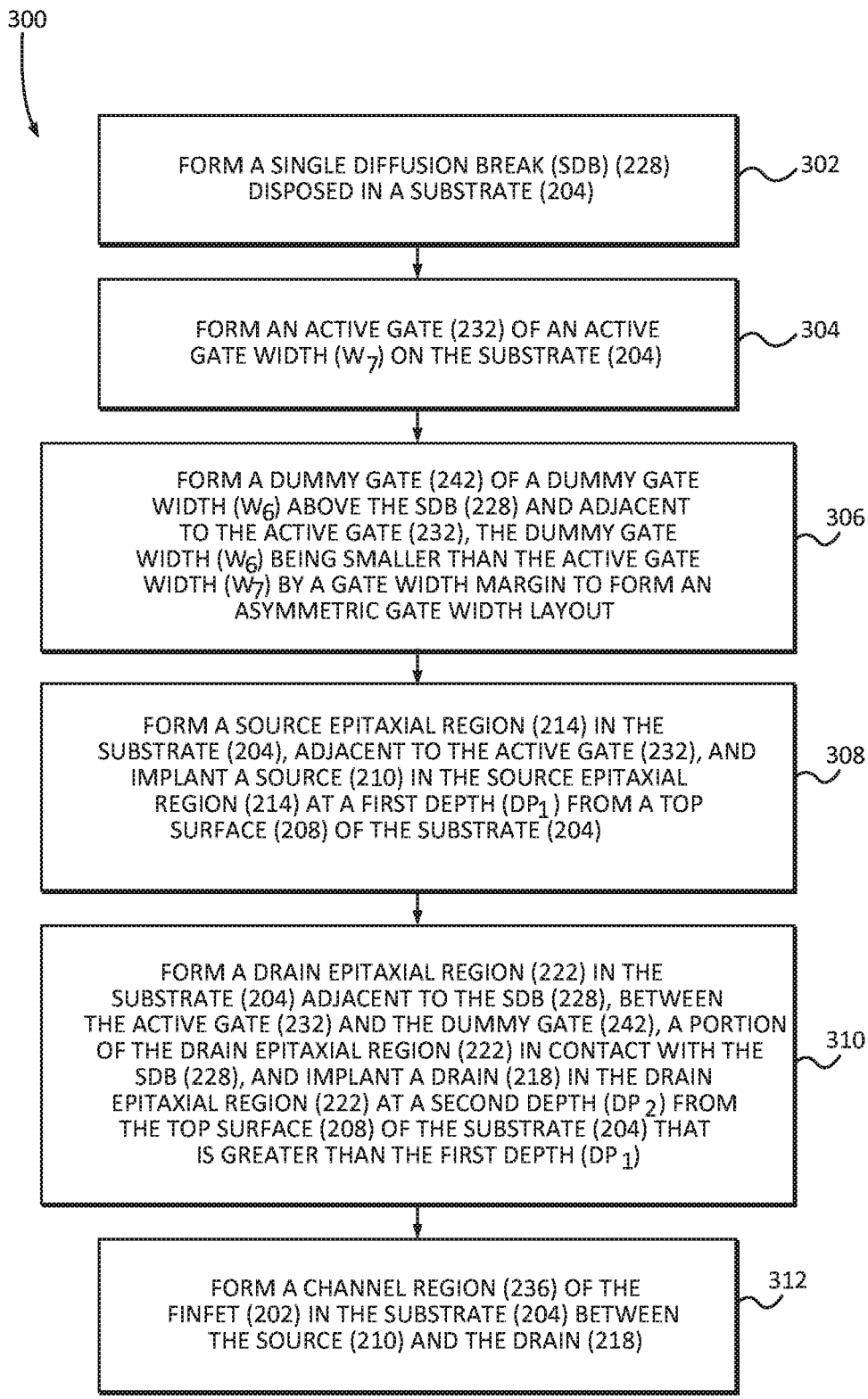
FIG. 3 is a flowchart illustrating an exemplary process for fabricating the exemplary FinFET cell of FIG. 2.

A FinFET cell employing an adjacent asymmetric active gate/dummy gate width layout, such as the FinFET cell 200 in FIG. 2, can be fabricated according to any fabrication processes desired. For example, FIG. 3 is a flowchart illustrating an exemplary process 300 for fabricating the exemplary FinFET cell 200 employing the adjacent asymmetric active gate/dummy gate width layout in FIG. 2. The steps in the process 300 are illustrated respectively in FIGS. 4A-4F. FIGS. 4A-4F will be referenced as the exemplary steps in the process 300 in FIG. 3 as described below.

A first exemplary step to fabricate the FinFET cell 200 illustrated in FIG. 2 includes forming the SDB 228 disposed in the substrate 204 (block 302 in FIG. 3). In this regard, FIG. 4A illustrates a stage 400(1) where the SDB 228 has been formed in the substrate 204. For example, forming the SDB 228 in the substrate 204 can be performed by etching a recess 402 on the substrate 204 and depositing an isolation material, such as an oxide, for example, to form the SDB 228 as the shallow trench isolation (STI) oxide 240. Forming the SDB 228 may further include polishing the SDB 228 using chemical-mechanical planarization (CMP), for example, to form a top surface 404 of the SDB 228 flush with the top surface 208 of the substrate 204.

A second exemplary step to fabricate the FinFET cell 200 illustrated in FIG. 2 includes forming the active gate 232 of the active gate width $W_7$ on the substrate 204 (block 304 in FIG. 3). A third exemplary step to fabricate the FinFET cell 200 illustrated in FIG. 2 includes forming the dummy gate 242 of a dummy gate width $W_6$ above the SDB 228 and adjacent to the active gate 232. The dummy gate width $W_6$ is formed smaller than the active gate width $W_7$ by a gate width margin to form an asymmetric gate width layout (block 306 in FIG. 3). In this regard, FIG. 4B illustrates a stage 400(2) where the active gate 232 of an active gate width $W_7$ has been formed on the substrate 204. The stage 400(2) further illustrates where the dummy gate 242 of a dummy gate width $W_6$ has been formed above the SDB 228. Forming the active gate 232 and the dummy gate 242 can be performed by disposing a polysilicon (PolySi) layer and a hard mask (HM) layer, and etching the polysilicon layer and the hard mask layer. Forming the active gate 232 and the dummy gate 242 can further include depositing spacer layers 406 and 408 to form a gate electrode pillar 410, and depositing spacer layers 412 and 414 to form a gate electrode pillar 416. The gate electrode pillars 410 and 416 correspond to the active gate 232 and the dummy gate 242, respectively.

Figure 4C:
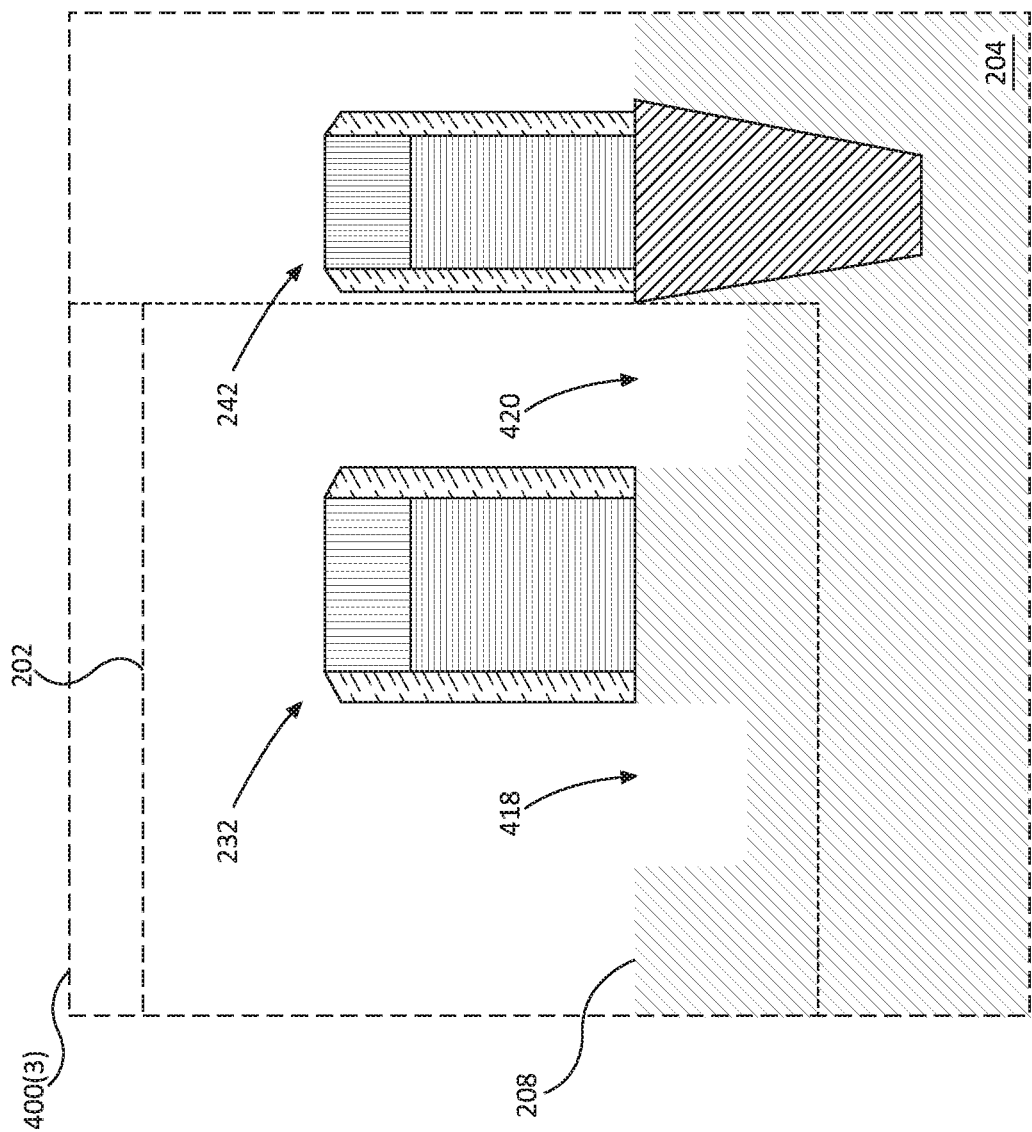
FIG. 4C is a cross-sectional diagram of an exemplary fabrication stage of etching recesses on a substrate for depositing a source epitaxial region and a drain epitaxial region for fabricating the exemplary FinFET cell illustrated in FIG. 2.

A fourth exemplary step to fabricate the FinFET cell 200 illustrated in FIG. 2 includes forming the source epitaxial region 214 of the FinFET 202 in the substrate 204, adjacent to the active gate 232, and implanting the source 210 in the source epitaxial region 214 at the depth $DP_1$ from the top surface 208 of the substrate 204 (block 308 in FIG. 3). A fifth exemplary step to fabricate the FinFET cell 200 illustrated in FIG. 2 includes forming the drain epitaxial region 222 in the substrate 204, adjacent to the SDB 228, between the active gate 232 and the dummy gate 242, wherein a portion of the drain epitaxial region 222 is in contact with the SDB 228, and implanting the drain 218 in the drain epitaxial region 222 at the depth $DP_2$ from the top surface 208 of the substrate 204 that is greater than the depth $DP_1$ (block 310 in FIG. 3). In this regard, FIG. 4C illustrates a stage 400(3) where the etching of a recess 418 and a recess 420 on the substrate 204 for depositing the source epitaxial region 214 and the drain epitaxial region 222, respectively, has been performed on the substrate 204.

Furthermore, FIG. 4D illustrates a stage 400(4) where depositing of the source epitaxial region 214 and the drain epitaxial region 222 on the recesses 418 and 420, respectively, has been performed. The stage 400(4) illustrates in particular that the drain epitaxial region 222 grows unevenly. This uneven growth is due to a facet mismatch between a facet 224 of the drain epitaxial region 222 and a facet 226 of the SDB 228. This facet 224, 226 mismatch hinders the growth of the drain epitaxial region 222 near the facet 226 of the SDB 228. Accordingly, growth of the drain epitaxial region 222 will be slower, and thus lower, near the facet 226 of the SDB 228 than the growth of the drain epitaxial region 222 away from the facet 226 of the SDB 228. Therefore, the drain epitaxial region 222 has an uneven top surface 230 that is lower near the SDB 228 and higher near the active gate 232.

Figure 4E:
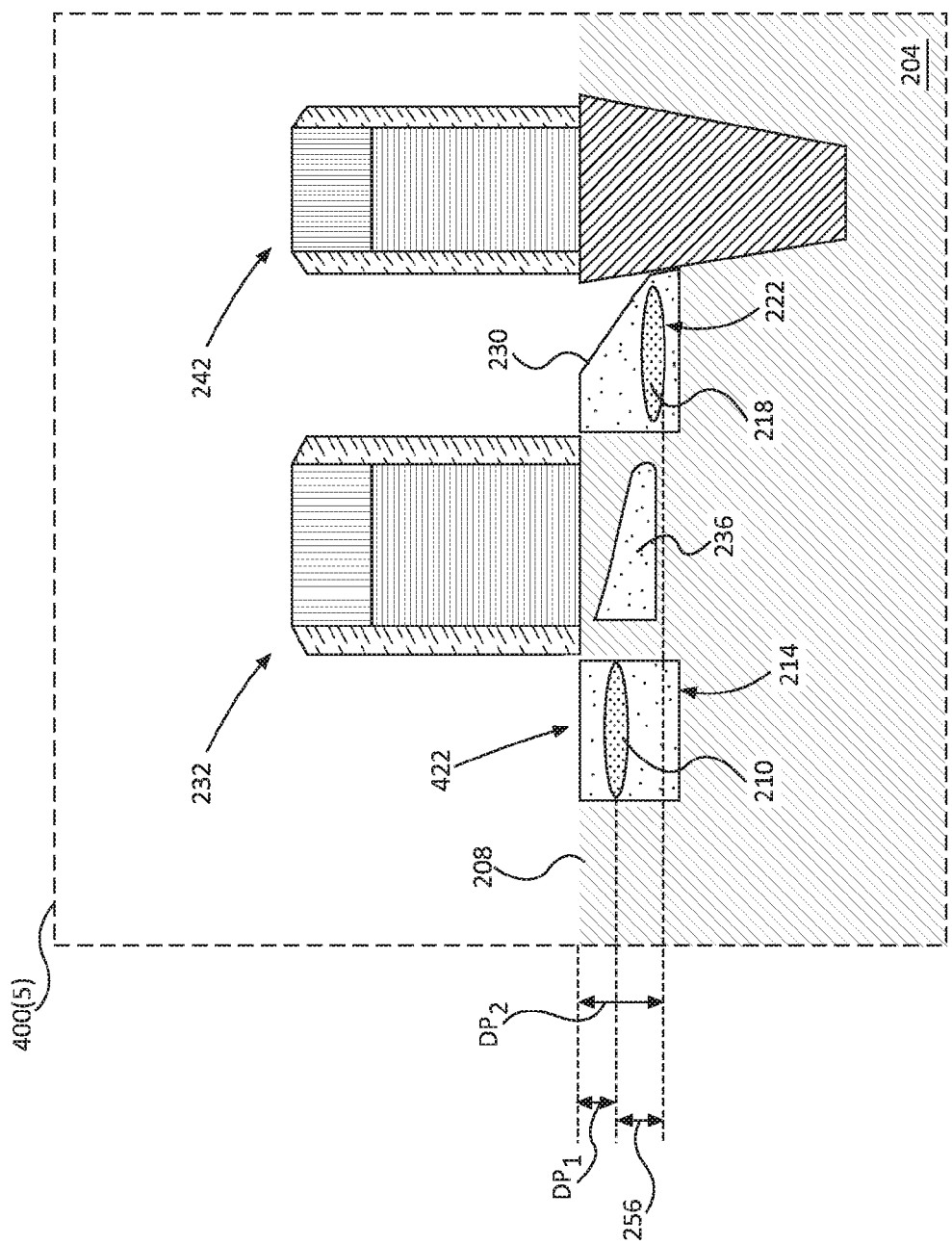
FIG. 4E is a cross-sectional diagram of an exemplary fabrication stage of forming a source and a drain in a source epitaxial region and a drain epitaxial region, respectively, for fabricating the exemplary FinFET cell illustrated in FIG. 2.

Furthermore, FIG. 4E illustrates a stage 400(5) where implanting of the source 210 and the drain 218 in the source epitaxial region 214 and the drain epitaxial region 222, respectively, has been performed. FIG. 4E illustrates that the source 210 is implanted at a depth $DP_1$ from the top surface 208 of the substrate 204. FIG. 4E further illustrates that the drain 218 is implanted at a depth $DP_2$ from the top surface 208 of the substrate 204 that is greater than the depth $DP_1$ by a source/drain implant margin 256. These implantations can be performed by, for example, ion implantation. The deeper implantation of the drain 218 is the result of the uneven growth of the drain epitaxial region 222. In particular, implantation is performed based on, for example, a time-based process that is performed equally on the source epitaxial region 214 and the drain epitaxial region 222. The uneven growth of the drain epitaxial region 222 causes the top surface 230 to be lower, in parts, than a top surface 422 of the source epitaxial region 214, which causes the implantation of the drain 218 to produce a drain 218 that is deeper relative to the source 210.

A sixth exemplary step to fabricate the FinFET cell 200 illustrated in FIG. 2 includes forming a channel region 236 of the FinFET 202 in the substrate 204 between the source 210 and the drain 218 (block 312 in FIG. 3). In this regard, the stage 400(5) illustrated in FIG. 4E shows the channel region 236, which is formed in the substrate 204 between the source 210 and the drain 218, and is activated, for example, when a voltage (not shown) is applied to the active gate 232.

Figure 4F:
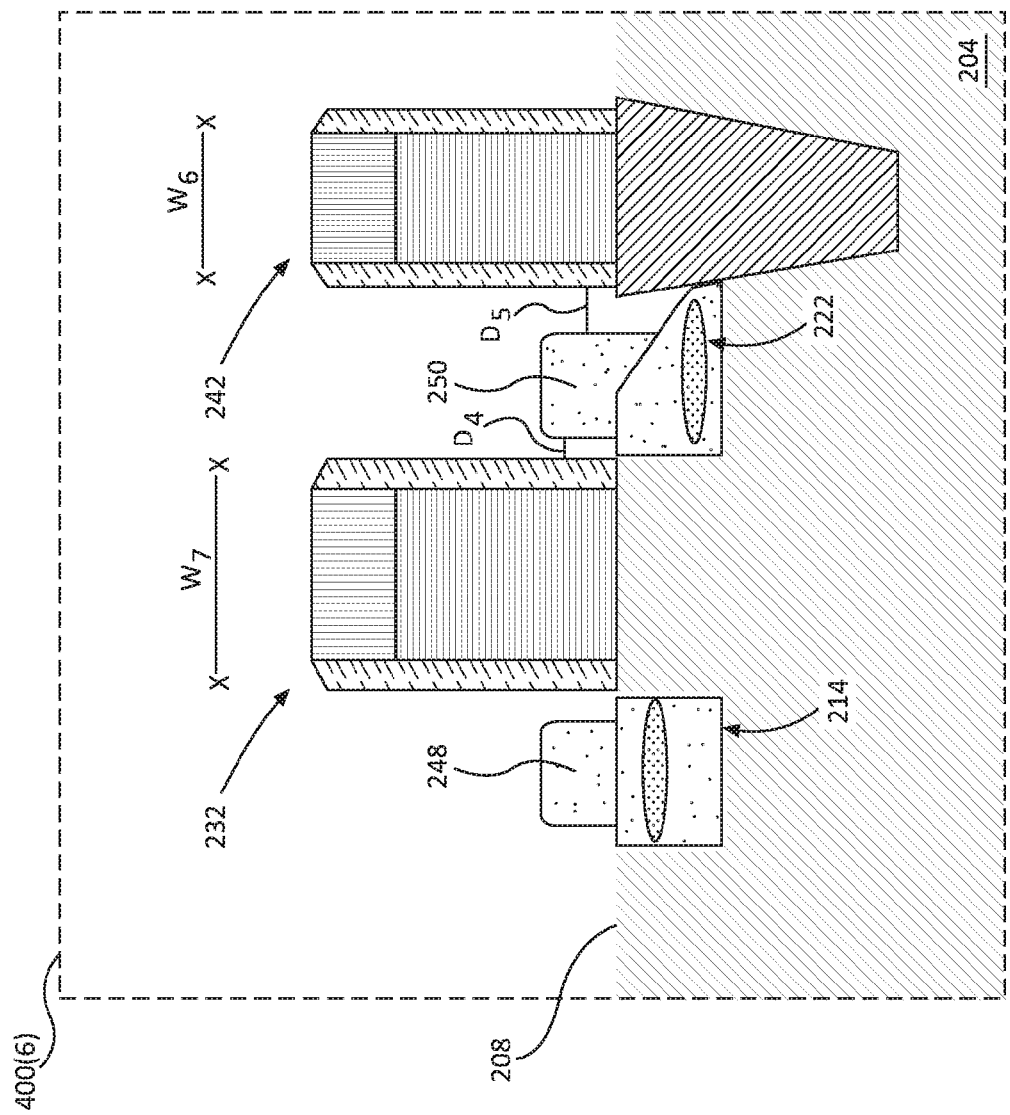
FIG. 4F is a cross-sectional diagram of an exemplary fabrication stage of disposing a source contact on a source epitaxial region adjacent to an active gate, and disposing a drain contact on a drain epitaxial region between the active gate and a dummy gate for fabricating the exemplary FinFET cell illustrated in FIG. 2.

A seventh exemplary step to fabricate the FinFET cell 200 illustrated in FIG. 2 includes disposing a source contact 248 on the source epitaxial region 214 adjacent to the active gate 232, and disposing a drain contact 250 on the drain epitaxial region 222 between the active gate 232 and the dummy gate 242, the drain contact 250 isolated from the adjacent active gate 232 by a distance D6 and isolated from the adjacent dummy gate 242 by a distance D7. In this regard, FIG. 4F illustrates a stage 400(6) of the seventh step in a cross-section view. The stage 400(6) illustrates the source contact 248 disposed on the source epitaxial region 214 adjacent to the active gate 232. The stage 400(6) further illustrates the drain contact 250 disposed on the drain epitaxial region 222 between the active gate 232 and the dummy gate 242. As explained earlier, the increase active gate width $W_7$ and the reduced dummy gate width $W_6$ result in the distance D7 being greater than the distance D6. This enhances the isolation of the FinFET 202 from the dummy gate 242, thereby decreasing a leakage current through the dummy gate 242.

In other aspects, an exemplary FinFET cell that includes an exemplary FinFET employing an adjacent asymmetric active gate/dummy gate width layout, which can promote increased gate control for reducing leakage current, can also include a means for providing a substrate. An example of a means for providing a substrate is shown as the substrate 204 in FIGS. 2 and 4A-4F. The FinFET cell can also include a means for providing a FET device comprising a means for providing a source disposed in the means for providing the substrate, a means for providing a drain disposed in the means for providing the substrate, and a means for providing an active gate of an active gate width formed between the means for providing the source and the means for providing the drain. An example of such means for providing a FET device is shown as the FinFET 202 in FIG. 2. An example of a means for providing an active gate is shown as the active gate 232 illustrated in FIGS. 2 and 4B-4F. The FinFET cell can also include a means for providing an isolation structure disposed in the means for providing the substrate, comprising a means for providing a diffusion break disposed in the means for providing the substrate adjacent to one of the means for providing the source and the means for providing the drain of the means for providing the FET device. The means for providing the isolation structure further comprises a means for providing a dummy gate of a dummy gate width formed above the means for providing the diffusion break adjacent to the means for providing the active gate. An example of such a means for providing an isolation structure is shown as the isolation structure 238 illustrated in FIG. 2.

The FET devices employing an adjacent asymmetric active gate/dummy gate width layout according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a smart phone, a tablet, a phablet, a server, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, and an automobile.

Figure 5:
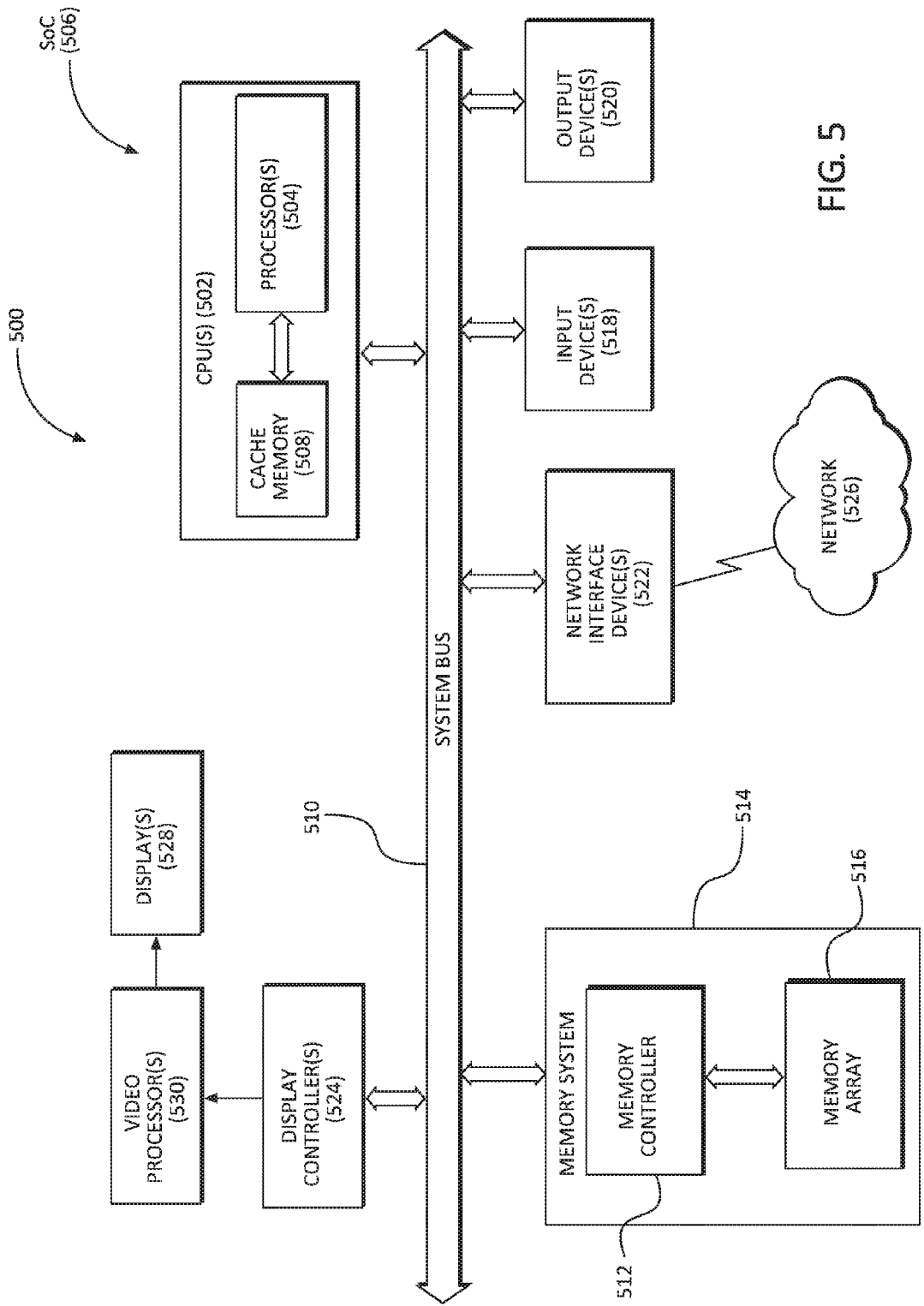
FIG. 5 is a block diagram of an exemplary processor-based system that can include the exemplary FinFET cell illustrated in FIG. 2.

In this regard, FIG. 5 is a block diagram of an exemplary processor-based system 500 that can include the exemplary FinFET cell 200 illustrated in FIG. 2. In this example, the processor-based system 500 includes one or more CPUs 502, each including one or more processors 504. The processor-based system 500 may be provided as a system-on-a-chip (SoC) 506. The CPU(s) 502 may have cache memory 508 coupled to the processor(s) 504 for rapid access to temporarily stored data. The CPU(s) 502 is coupled to a system bus 510 and can intercouple master and slave devices included in the processor-based system 500. As is well known, the CPU(s) 502 communicates with these other devices by exchanging address, control, and data information over the system bus 510. For example, the CPU(s) 502 can communicate bus transaction requests to a memory controller 512 in a memory system 514 as an example of a slave device. Although not illustrated in FIG. 5, multiple system buses 510 could be provided, wherein each system bus 510 constitutes a different fabric. In this example, the memory controller 512 is configured to provide memory access requests to a memory array 516 in the memory system 514.

Other devices can be connected to the system bus 510. As illustrated in FIG. 5, these devices can include the memory system 514, one or more input devices 518, one or more output devices 520, one or more network interface devices 522, and one or more display controllers 524, as examples. The input device(s) 518 can include any type of input device, including but not limited to input keys, switches, voice processors, etc. The output device(s) 520 can include any type of output device, including but not limited to audio, video, other visual indicators, etc. The network interface device(s) 522 can be any devices configured to allow exchange of data to and from a network 526. The network 526 can be any type of network, including but not limited to a wired or wireless network, a private or public network, a local area network (LAN), a wireless local area network (WLAN), a wide area network (WAN), a BLUETOOTH™ network, and the Internet. The network interface device(s) 522 can be configured to support any type of communications protocol desired.

The CPU(s) 502 may also be configured to access the display controller(s) 524 over the system bus 510 to control information sent to one or more displays 528. The display controller(s) 524 sends information to the display(s) 528 to be displayed via one or more video processors 530, which process the information to be displayed into a format suitable for the display(s) 528. The display(s) 528 can include any type of display, including but not limited to a cathode ray tube (CRT), a liquid crystal display (LCD), a plasma display, etc.

Figure 6:
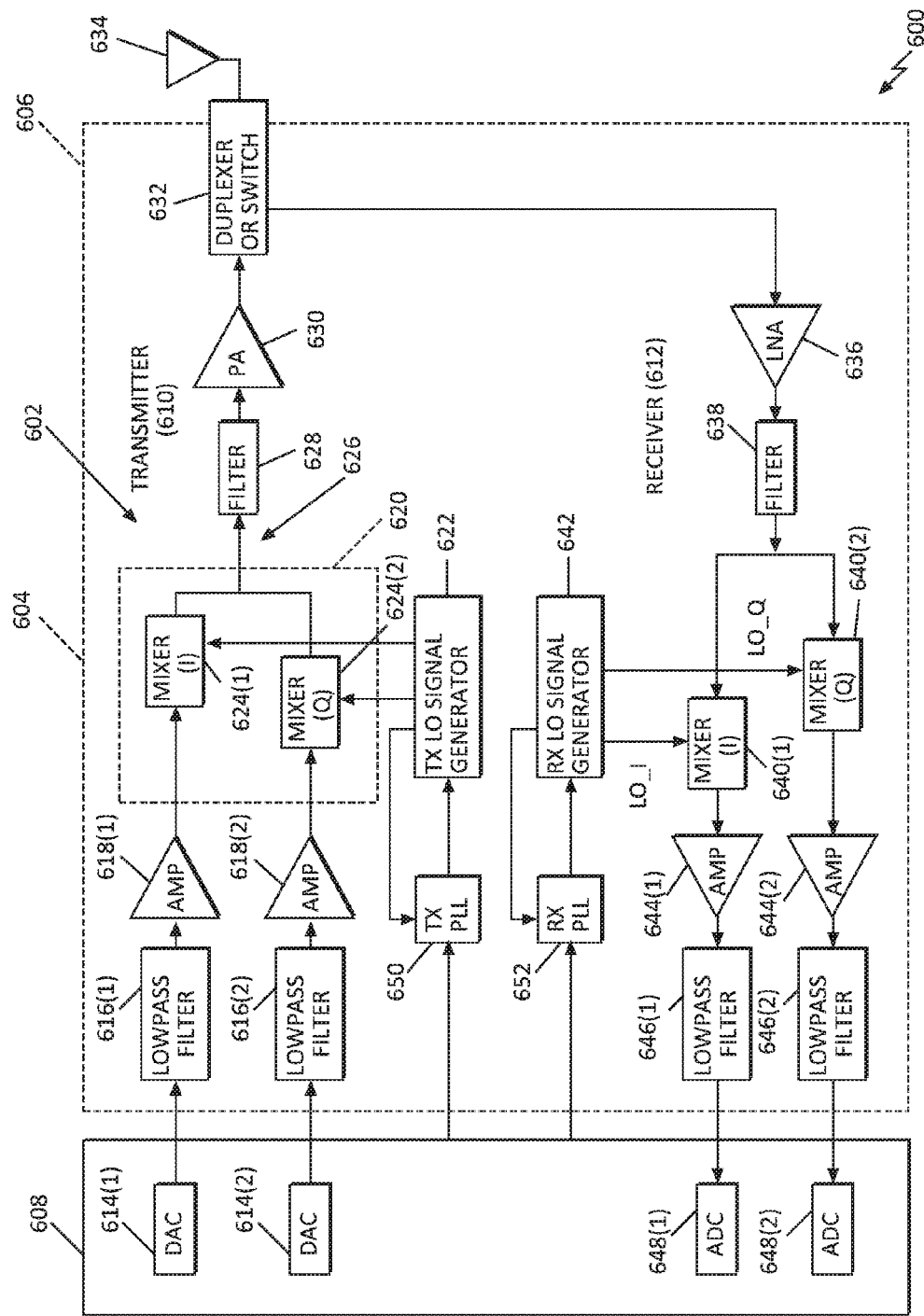
FIG. 6 is a block diagram of an exemplary wireless communications device that includes radio-frequency (RF) components which include FinFET cells that include an exemplary FinFET employing an adjacent asymmetric active gate/dummy gate width layout according to the exemplary aspects disclosed herein.

FIG. 6 illustrates an example of a wireless communications device 600 which can include RF components in which a FinFET cell that includes an exemplary FinFET employing an adjacent asymmetric active gate/dummy gate width layout, including but not limited to the FinFET cell 200 in FIG. 2, may be included. In this regard, the wireless communications device 600, including a FinFET cell that includes an exemplary FinFET employing an adjacent asymmetric active gate/dummy gate width layout, may be provided in an integrated circuit (IC) 606. The wireless communications device 600 may include or be provided in any of the above referenced devices, as examples. As shown in FIG. 6, the wireless communications device 600 includes a transceiver 604 and a data processor 608. The data processor 608 may include a memory (not shown) to store data and program codes. The transceiver 604 includes a transmitter 610 and a receiver 612 that support bi-directional communication. In general, the wireless communications device 600 may include any number of transmitters and/or receivers for any number of communication systems and frequency bands. All or a portion of the transceiver 604 may be implemented on one or more analog ICs, RF ICs (RFICs), mixed-signal ICs, etc.

A transmitter 610 or a receiver 612 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for a receiver 612. In the direct-conversion architecture, a signal is frequency converted between RF and baseband in one stage. The super-heterodyne and direct-conversion architectures may use different circuit blocks and/or have different requirements. In the wireless communications device 600 in FIG. 6, the transmitter 610 and the receiver 612 are implemented with the direct-conversion architecture.

In the transmit path, the data processor 608 processes data to be transmitted and provides I and Q analog output signals to the transmitter 610. In the exemplary wireless communications device 600, the data processor 608 includes digital-to-analog-converters (DACs) 614(1) and 614(2) for converting digital signals generated by the data processor 608 into the I and Q analog output signals, e.g., I and Q output currents, for further processing.

Within the transmitter 610, lowpass filters 616(1), 616(2) filter the I and Q analog output signals, respectively, to remove undesired images caused by the prior digital-to-analog conversion. Amplifiers (AMP) 618(1), 618(2) amplify the signals from the lowpass filters 616(1), 616(2), respectively, and provide I and Q baseband signals. An upconverter 620 upconverts the I and Q baseband signals with I and Q transmit (TX) local oscillator (LO) signals through mixers 624(1), 624(2) from a TX LO signal generator 622 to provide an upconverted signal 626. A filter 628 filters the upconverted signal 626 to remove undesired images caused by the frequency upconversion as well as noise in a receive frequency band. A power amplifier (PA) 630 amplifies the upconverted signal 626 from the filter 628 to obtain the desired output power level and provides a transmit RF signal. The transmit RF signal is routed through a duplexer or switch 632 and transmitted via an antenna 634.

In the receive path, the antenna 634 receives signals transmitted by base stations and provides a received RF signal, which is routed through the duplexer or switch 632 and provided to a low noise amplifier (LNA) 636. The duplexer or switch 632 is designed to operate with a specific RX-to-TX duplexer frequency separation, such that RX signals are isolated from TX signals. The received RF signal is amplified by the LNA 636 and filtered by a filter 638 to obtain a desired RF input signal. Downconversion mixers 640(1), 640(2) mix an output of the filter 638 with I and Q receive (RX) LO signals (i.e., LO_I and LO_Q) from an RX LO signal generator 642 to generate I and Q baseband signals. The I and Q baseband signals are amplified by amplifiers (AMP) 644(1), 644(2) and further filtered by lowpass filters 646(1), 646(2) to obtain I and Q analog input signals, which are provided to the data processor 608. In this example, the data processor 608 includes analog-to-digital-converters (ADCs) 648(1), 648(2) for converting the analog input signals into digital signals to be further processed by the data processor 608.

In the wireless communications device 600 in FIG. 6, the TX LO signal generator 622 generates the I and Q TX LO signals used for frequency upconversion, while the RX LO signal generator 642 generates the I and Q RX LO signals used for frequency downconversion. Each LO signal is a periodic signal with a particular fundamental frequency. A transmit (TX) phase-locked loop (PLL) circuit 650 receives timing information from the data processor 608 and generates a control signal used to adjust the frequency and/or phase of the TX LO signals from the TX LO signal generator 622. Similarly, a receive (RX) phase-locked loop (PLL) circuit 652 receives timing information from the data processor 608 and generates a control signal used to adjust the frequency and/or phase of the RX LO signals from the RX LO signal generator 642.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A Field-Effect Transistor (FET) cell, comprising:
a FET device, comprising:
a source; and
a drain;
an active gate of an active gate width between approximately fifteen (15) nanometers (nm) and approximately eighteen (18) nm formed between the source and the drain;
a solitary isolation structure comprising a diffusion break disposed in a substrate adjacent to only one of the source and the drain of the FET device; and
a dummy gate of a dummy gate width between approximately thirteen (13) nm and approximately fourteen (14) nm formed adjacent to the active gate, the dummy gate width being smaller than the active gate width by a gate width margin.

2. The FET cell of claim 1, further comprising:
a source contact disposed above the source adjacent to the active gate; and
a drain contact disposed above the drain adjacent to the active gate,
wherein one of the source contact and the drain contact is disposed between the active gate and the dummy gate, and isolated from the active gate by a first distance and isolated from the dummy gate by a second distance that is different than the first distance by an isolation margin.

3. The FET cell of claim 2, wherein the FET device comprises a FinFET device, comprising:
a channel region disposed in the substrate;
the source disposed on a first side of the channel region, adjacent to the channel region;
the drain disposed on a second side of the channel region opposite the first side, and adjacent to the channel region; and
the active gate disposed around and adjacent to at least a portion of the channel region.

4. The FET cell of claim 2, wherein:
the isolation margin is approximately one (1) nm.

5. The FET cell of claim 2, wherein:
the isolation margin is approximately two (2) nm.

6. The FET cell of claim 1, wherein the gate width margin is at least two (2) nanometers (nm).

7. The FET cell of claim 1, wherein:
the gate width margin is at least four (4) nanometers (nm).

8. The FET cell of claim 1 integrated into an integrated circuit (IC).

9. The FET cell of claim 1 integrated into a device selected from the group consisting of: a set top box; an entertainment unit; a navigation device; a communications device; a fixed location data unit; a mobile location data unit; a mobile phone; a cellular phone; a smart phone; a tablet; a phablet; a server; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; and an automobile.

10. A method of fabricating a Field-Effect Transistor (FET) cell, comprising:
forming an active gate of an active gate width between approximately fifteen (15) nanometers (nm) and approximately eighteen (18) nm on a substrate;
forming a dummy gate of a dummy gate width between approximately thirteen (13) nm and approximately fourteen (14) nm adjacent to the active gate, the dummy gate width being smaller than the active gate width by a gate width margin;
forming a source region of a FET device in the substrate, adjacent to the active gate;

forming a source in the source region at a first depth from a top surface of the substrate;

forming a drain region of the FET device in the substrate between the active gate and the dummy gate;

forming a drain in the drain region at a second depth from the top surface of the substrate that is greater than the first depth; and forming a channel region of the FET device in the substrate between the source and the drain.

11. The method of claim 10, wherein forming the dummy gate comprises forming the dummy gate comprising the dummy gate width that is smaller than the active gate width by the gate width margin of at least two (2) nanometers (nm).

12. The method of claim 10, wherein:

forming the dummy gate comprises forming the dummy gate comprising the dummy gate width that is smaller than the active gate width by the gate width margin of at least four (4) nanometers (nm).

13. The method of claim 10, further comprising:

disposing a source contact on the source region adjacent to the active gate; and disposing a drain contact on the drain region between the active gate and the dummy gate, the drain contact isolated from the active gate by a first distance and isolated from the dummy gate by a second distance that is greater than the first distance by an isolation margin.

14. The method of claim 13, wherein:

forming the dummy gate comprises forming the dummy gate to provide the isolation margin that is approximately one (1) nm.

15. The method of claim 13, wherein:

forming the dummy gate comprises forming the dummy gate to provide the isolation margin that is approximately two (2) nm.

16. The method of claim 10, wherein:

forming the source in the source region comprises implanting the source in the source region at the first depth from the top surface of the substrate; and forming the drain in the drain region comprises implanting the drain in the drain region at the second depth from the top surface of the substrate that is greater than the first depth.

* * * * *